United States Patent [19]

Foo et al.

[11] Patent Number: 6,067,465
[45] Date of Patent: May 23, 2000

[54] SYSTEM AND METHOD FOR DETECTING AND TRACKING REFERENCE POSITION CHANGES WITH LINEAR PHASE SHIFT IN MAGNETIC RESONANCE IMAGING

[75] Inventors: Thomas K. F. Foo, Rockville, Md.; Kevin F. King, Megnon, Wis.

[73] Assignee: General Electric Company, Milwaukee, Wis.

[21] Appl. No.: 08/980,192

[22] Filed: Nov. 26, 1997

[51] Int. Cl.[7] .................................................. A61B 5/055
[52] U.S. Cl. .......................................... 600/410; 324/309
[58] Field of Search .................................. 600/410, 413; 324/309, 307

[56] References Cited

U.S. PATENT DOCUMENTS

| | | | |
|---|---|---|---|
| 4,593,247 | 6/1986 | Glover | 324/309 |
| 5,570,019 | 10/1996 | Moonen et al. | 324/309 |
| 5,771,096 | 6/1998 | Anderson | 356/346 |
| 5,899,858 | 5/1999 | Muthupillai et al. | 600/410 |

OTHER PUBLICATIONS

Ehman RL, Felmlee JP. Adaptive technique for high definition MR imaging of moving structures. *Radiology* 1988; 173:255–263.

McConnell MV, Khasgiwala VC, Savord BJ, Chen MH, et al. Prospective adaptive navigator correction for breath–hold MR coronary angiography. *Magn. Reson. Med.* 1997; 37: 148–152.

McConnell MV, Khasgiwala VC, Savord BJ, Chen, MH, et al. Comparison of respiratory suppression methods and navigator locations for MR coronary angiography. *Am. J. Roentgenol.* 1997; 168: 1369–1375.

Li D, Kaushikkar S, Haacke EM, Woodard PK, et al. Coronary arteries: Three dimensional MR imaging with retrospective respiratory gating. *Radiology* 1996; 201: 857–863.

Wang Y, Grimm RC, Felmlee JP, Riederer SJ, Ehman RL. Algorithms for extracting motion information from navigator echoes. *Magn. Reson. Med.* 1996; 36: 117–123.

Hu X, Kim SG. Reduction of signal fluctuation in functional MRI using navigator echoes. *Magn. Reson. Med.* 1994; 31: 495–503.

Hu X, Le TH, Parrish T, Erhrd P. Retrospective estimation and correction of physiological fluctuation in functional MRI. *Magn. Reson. Med.* 1995; 34: 201–212.

Le TH, Hu X. Retrospective estimation and correction of physiological artifacts in fMRI by direct extraction of physiological activity from MR data. *Magn. Reson. Med.* 1996; 35: 290–298.

(List continued on next page.)

*Primary Examiner*—Brian L. Casler
*Attorney, Agent, or Firm*—Whyte, Hirschboeck & Dudek; Christian G. Cabou; Phyllis Y. Price

[57] ABSTRACT

A fast and computationally efficient system and method is disclosed for detecting and tracking the position of a reference structure in the body using a linear phase shift to minimize motion artifacts in magnetic resonance imaging. In one application, the system and method is used to determine the relative position of the diaphragm in the body in order to synchronize data acquisition to the same relative position with respect to the abdominal and thoracic organs to minimize respiratory motion artifacts. The system and method uses the time domain linear phase shift of the reference structure data in order to determine its spatial positional displacement as a function of the respiratory cycle. The signal from a two-dimensional rectangular or cylindrical column is first Fourier transformed to the image domain, apodized or bandwidth-limited, converted to real, positive values by taking the magnitude of the profile, and then transformed back to the image domain. The relative displacement of a target edge in the image domain is determined from an auto-correlation of the resulting time domain information.

23 Claims, 3 Drawing Sheets

OTHER PUBLICATIONS

Ahn CB, Cho ZH. A new phase correction method in NMR imaging based on autocorrelation and histogram analysis. *IEEE Trans. Med. Imaging* 1987; MI–6: 32–36.

Korin H.W., Farzaheh F., Wright R.C., Riederer S.J. Compensation for effects of linear motion in MR Imaging. *Magn. Reson. Med.,* 1989; 12, 99–113.

Oshinski J.N., Hofland L., Mukundan S., Dixon W. T., Parks W.J., Pettigrew R.I. Two–dimensional coronary MR angiography without breath holding. *Radiology.* 1996; 201: 737–743.

Taylor A M., Jhooti J., Wiesmann F., Keegan J., Firmin D., Pennell D.J. MR navigator–echo monitoring of temporal changes in diaphragm position: implications for MR coronary Angiography. *JMRI.* 1997; 7: 629–636.

Müller M.F., Fleisch M., Kroeker R., Chatterjee T., Jmeier B., Vock P. Proximal coronary artery stenosis: three–dimensional MRI with fat saturation and navigator echo. *JMRI* 1997; 7: 644–651.

Danias P.G., McConnell M.V., Khasgiwala V.C., Chuang M.L., Edelman R.R., Manning W.J. Prospective navigator correction of image position for coronary MR angiography. *Radiology* 1997; 203: 733–736.

SYSTEM AND METHOD FOR DETECTING AND TRACKING REFERENCE POSITION CHANGES WITH LINEAR PHASE SHIFT IN MAGNETIC RESONANCE IMAGING

BACKGROUND OF THE INVENTION

The present invention relates generally to magnetic resonance imaging (MRI), and more particularly to a system and method for detecting and tracking positional changes in a reference structure using a linear phase shift technique to eliminate or significantly reduce the effects of motion artifacts in an MR image.

Respiratory motion artifacts degrade image quality in non-breath-held MR scans. That is, MR scans where the patient is either allowed to breath freely, breaths inadvertently, or in MR studies that require scan times in excess of a typical patient's ability to hold their breath. In these cases, some technique other than simply having the patient hold their breath, must be used to minimize respiratory motion artifacts.

A class of techniques, known as navigator-type sequences use MR to periodically image a two-dimensional column of spins that include the diaphragm. By detecting changes in the diaphragm position, data acquisition can be synchronized to a common position in the respiratory cycle. In this manner, MR data acquisition is gated to a specific position of the diaphragm, and by implication, to a specific position of the internal organs in the thoracic and abdominal cavities.

Prior art methods of detecting such positional changes have relied upon the use of cross-correlation or least-squares algorithms. Such algorithms are computationally intensive since they require cross-correlation or least-squares determination against a reference profile for a series of different pixel shifts in the sample viewed. The spatial shift that corresponds to the greatest value of the cross-correlation or the minimum value of the least-squares difference will yield the position of the diaphragm relative to the reference position, but only in terms of whole pixels. With such methods, the reference profile or position must always be manually selected before the start of data acquisition by an MR scan operator.

An alternate prior art method to using navigators is to use the phase of the echo peak, or the center of the k-space phase, as an indication of the relative displacement of the reference object. Although this has been used to correct for motion-related artifacts in neuro-functional imaging studies, it is not suitable for monitoring the displacement of the diaphragm because the phase of the echo peak includes the phase of all spins in the image field-of-view and is unable to extract the displacement of a single reference structure. Further, such a method cannot monitor diaphragmatic motion where a projection profile in the superior-inferior orientation includes moving structures (liver, stomach, etc.) and non-moving structures (lung field, shoulder). This method also requires manual input of an initial positional selection by an MRI operator.

Therefore, it would be desirable to have a system and method for detecting and tracking positional changes in a reference structure that is computationally efficient, is not reliant on operator input or influence, or on pixel size, and eliminates the need to require a patient to breath-hold, thereby eliminating an additional patient stress factor during a magnetic resonance imaging procedure.

SUMMARY OF THE INVENTION

The present invention provides a system and method for detecting and tracking positional changes in a reference structure using a linear phase shift technique for use in magnetic resonance imaging that overcomes the aforementioned problems.

In accordance with one aspect of the invention, a system and method for reference structure position determination using linear phase shift for use in MRI, includes the steps of acquiring sample data representative of a reference position of a reference structure. The sample data is acquired at a first time (T) in a time domain. The acquired time domain sample data is then transformed into an image space domain and apodized, or bandwidth limited, about a center point. The data is then converted to real, positive values by taking the magnitude of the data profile, and then inverse transforming it back to the time domain. A phase shift is determined for each data sample and used to a relative positional variation of the reference structure at that time.

The present invention uses a linear phase shift of the time domain or k-space data to determine the relative spatial displacements of a diaphragm. Data over the entire modified k-space representation of the projection or navigator profile is used rather than the phase of a single k-space point. This approach has proven effective in a prospective respiratory, navigator-gated and ECG-gated fast 3D gradient echo acquisition of the coronary arteries. The method and system of the present invention can yield equivalent results to the prior art methods but with much greater speed and without operator input.

The present invention is implemented as an initial training period used prior to the start of MR imaging acquisition. During this training period, the minimum and maximum relative phase shifts from the time domain data are calculated. These values correspond to the relative position of the reference structure, that is, the minimum and maximum displacement. Where the reference structure is the diaphragm, these values correspond to end-inspiration and end-expiration points, respectively, in the respiratory cycle. Since the proposed method automatically determines the reference profile, there is no need for an operator to manually select a reference profile.

Accordingly, one object of the present invention is to provide a method and system for detecting and tracking respiratory motion changes by monitoring phase shifts in a data pulse sequence with significantly shorter processing times than prior art methods.

Another advantage to using the linear phase shift technique of the present invention is the ability to obtain displacements on the order of fractional pixels, whereas prior art methods are restricted to entire discrete pixel displacements. The ability to measure fractional pixel displacements allows the use of larger pixel sizes, which can further reduce the computational overhead by an estimated factor of two.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
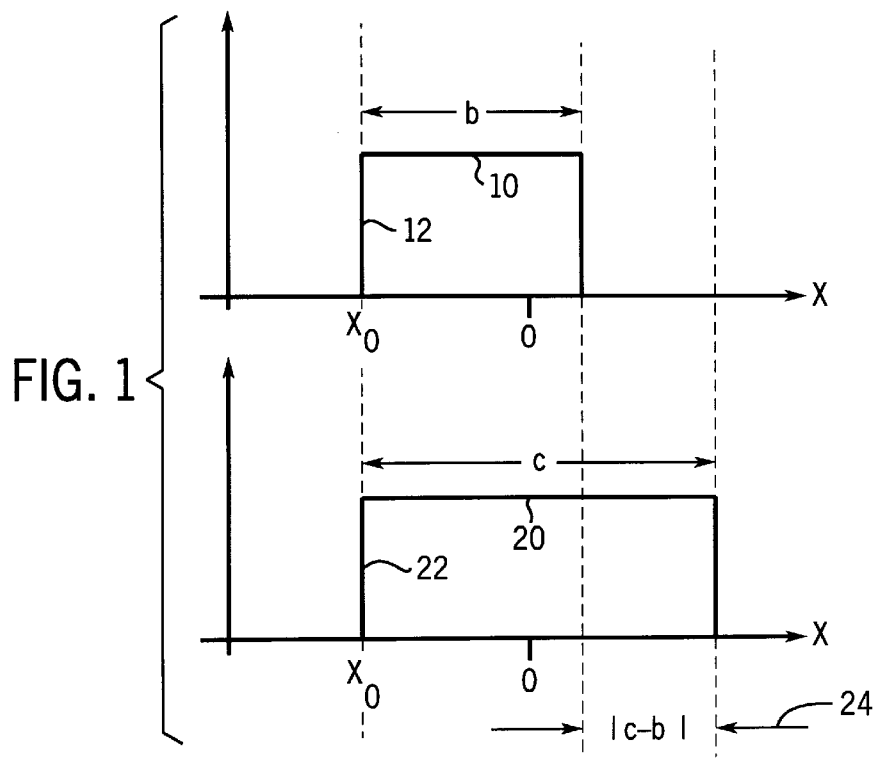
FIG. 1 shows an example of two signal profiles as a function of displacement versus magnitude.

Referring to FIG. 1, two data profiles 10 and 20 are shown having a width b and c, respectively. Since the data has been apodized, or bandwidth limited within a predefined window, the two profiles share a common edge 12 and 22 at $X=X_0$. The relative displacement between the two profiles 24 is then $|c-b|$. Based on the well known Fourier Transform Shift Theorem, if an object that is centered about the origin is shifted, then the Fourier transform of that function will have a linear phase shift that is equivalent to the amount of shift in X.

Figure 2:
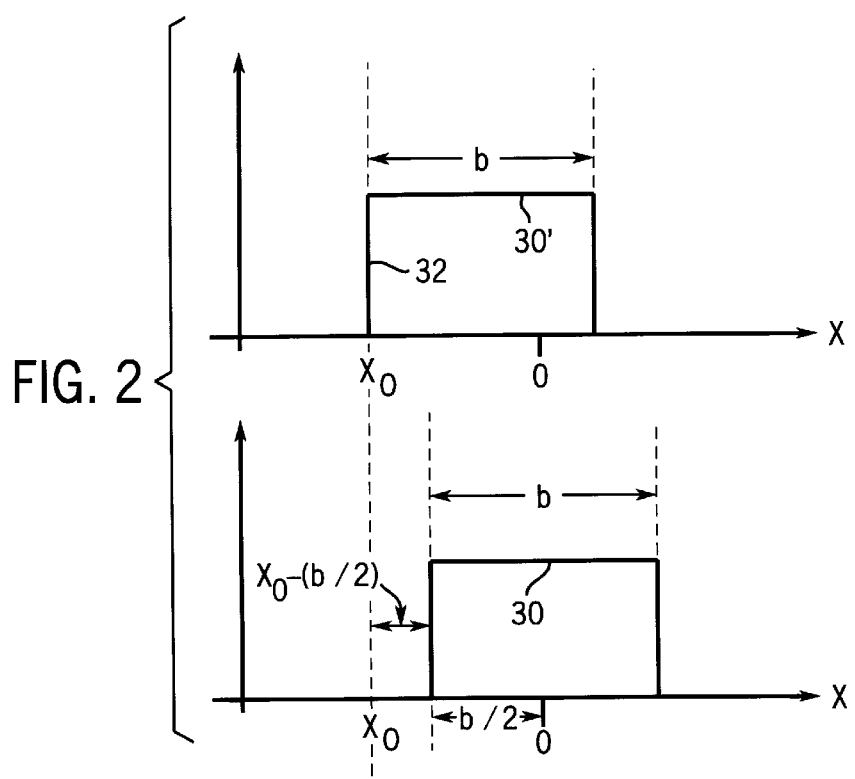
FIG. 2 shows an exemplary phase shift of a signal profile.

As shown in FIG. 2, an exemplary signal 30 is shown having a width b. The signal 30 is also shown shifted as signal 30' such that the left most edge 32 is at $X=X_0$. In this case, the amount of shift is $X_0-(b/2)$. Similarly, the amount of shift to move the left most edge 32 of a signal profile having width c to $X=X_0$ would be $X_0-(c/2)$.

The linear phase shift for moving the signal profile of width b such that the left most edge is at $X=X_0$ corresponds to a spatial shift of displacement_$b=X_0-(b/2)$. The linear phase shift for the signal profile of width c corresponds to a spatial shift of displacement_$c=X_0-(c/2)$. The relative phase shift between the two signal profiles then, corresponds to a relative spatial displacement of displacement_$bc=|(c-b)|/2$. Since the actual displacement is $|(c-b)|$, a factor of 2 must be considered in the determination of the true spatial displacement from the linear phase shift data.

With this basic understanding, the present invention can now be described in more detail. The present invention uses a linear phase shift in the k-space as a determination of the diaphragm position, or of any other anatomical reference structure. Since positional shifts in frequency space translates to a linear phase shift in the Fourier time domain, the linear phase shift extracted from the k-space data will give the necessary positional displacement information.

Since the minimum and maximum values of the linear phase shift correspond to the extreme positional displacements of the reference structure, there is no need to compare these results against a pre-selected reference profile, as with the prior art cross-correlation or least-squares methods. The end-inspiration or end-expiration locations can then be determined independently of any operator input. Furthermore, this technique can also be used in conjunction with the regular bellows or pressure transducer to correlate the expansion of the chest wall with the diaphragm position obtained by linear phase shifts.

The theory behind this method will now be described. If f(t) is the time domain data obtained by using a tracking MR pulse sequence or navigator echo, such as an orthogonal 90°–180° pulse sequence or a cylindrical two-dimensional selective RF pulse, the Fourier transform of this data is a profile of the spins detected along that two-dimensional excitation column, or a one-dimensional projection profile, and can be given as:

$$\underline{F}\{F(T)\}=f(x); \quad [1]$$

where f(x) in this case is complex-valued, and where $\underline{F}\{\}$ denotes the Fourier transform operation. The magnitude of this profile may be taken to eliminate additional phase from flow-related phenomenon. If $x_0$ is the position of the reference structure within this profile, then displacement of that structure from the central, zero image space pixel, is equivalent to:

$$\underline{F}^{-1}\{|f(x+x_0)|\}=F(t)\exp(j\phi_0 t); \quad [2]$$

where $\underline{F}^{-1}\{\}$ denotes the inverse Fourier transform operation. The further the displacement, the larger the linear phase term $\phi_0$. Since there is no need to consider the displacement of other structures within the column, a low-pass windowing filter is used in the frequency domain to examine the linear phase shift due only to displacement of the reference structure.

By selecting the center of the column field-of-view to coincide with the diaphragm, or any other suitable reference structure, an apodizing filter H(x) is used on the frequency data to bandwidth limit the signal profile within a window such that:

$$H(x) = \begin{cases} 1 - W/2 < x < +W/2 - 1 \\ 0 \text{ otherwise.} \end{cases} \quad [3]$$

Typically, W covers about a 6–10 Mr. Charles C. Mulcahy region of the tracking or navigator echo profile. For each tracking acquisition, a signal profile can be expected in which the reference structure is displaced by d pixels. In this case, the time domain signal is:

$$\underline{F}^{-1}\{H(x)\cdot|f(x+x_0+d)|\}=F(t)\exp(j(\phi_0+\phi_d)t); \quad [4]$$

where $\phi_d$ is the linear phase shift due to an additional displacement d of the reference structure located at $X=X_0$. The linear phase shift can then be determined by using the Ahn algorithm, as found in Ahn CB, Cho ZN: A NEW PHASE CORRECTION METHOD IN NMR IMAGING BASED ON AUTO-CORRELATION AND HISTOGRAM ANALYSIS; *IEEE trans. Med. Imaging* 1987; MI-6:32–36; since this requires the consideration of only a single auto-correlation of the time domain data. Rewriting equation [4] as:

$$\hat{F}(t)=F(t)\exp(j(\phi_0+\phi_d)t); \quad [5]$$

then using the Ahn algorithm, the phase is given as:

$$\phi_0+\phi_d=-\arg(E[\hat{F}(t)\cdot\hat{F}*(t+1)]); \quad [6]$$

where $E[\cdot]$ represents the expectation value of the product and * denotes the complex conjugate. Equation [6] can also be expressed as:

$$\phi = \phi_0 + \phi_d = -\tan^{-1}\left(\frac{\sum_N Im(\hat{F}(t)\cdot\hat{F}*(t+1))}{\sum_N Re(\hat{F}(t)\cdot\hat{F}*(t+1))}\right); \quad [7]$$

where N is the number of pixels in the time domain data. The minimum or maximum value of $\phi$ then corresponds to the relative displacement for each sample profile. The value of the linear phase shift includes a constant offset due to the initial displacement ($X=X_0$) of the reference structure from the center of the profile window. The change in Eqn. [7] from sample profile to sample profile gives the relative displacement of the reference structure.

To estimate the computational efficiency of this method and system, all floating point operations are assumed equivalent. In the present invention, there are N complex multiplications (4N floating point multiplications and 2N additions) and 2N more additions. Accounting for the apodizing filter H(x), and the fast Fourier transform (FFT), the number of operations using the proposed linear phase shift method is:

$$\text{lin\_ph\_shift} = 9N + N \log_2 N. \qquad [8]$$

For N=256, Eqn.[8] gives 4,352 FLOPs, a substantial reduction in the number of computations from using either least-squares or cross-correlation. This speeds up the processing of navigator echoes by a factor of between four and six, depending on the original method of calculating positional shifts. A summary of the theoretical computational costs of all three approaches is given in Table 1.

TABLE 1

| Method | D = 64 | D = 128 |
| --- | --- | --- |
| Cross-correlation (N = 256) | 16,384 | 32,768 |
| Least-squares (N = 256) | 24,576 | 49,152 |
| Phase shift (N = 256) | 4,352 | 4,352 |
| Phase shift (N = 128) | 2,048 | 2,048 |

Where the cross-correlation and least-squares methods can only determine the displacement to the nearest whole pixels, the linear phase shift method of the present invention is able to interpolate displacements between whole pixels. Since the present invention allows for fractional pixel shifts, the computation time can be further reduced by using N=128 in $|f(x)|$, instead of N=256. This ability to measure fractional pixel displacement allows further reduction in the number of floating point operations without compromising positional displacement information. An analysis using the same MR navigator echo data set, has found no significant difference in results between using N=128 and N=256 for linear phase shift processing, but offered a substantial reduction in data processing time.

The computational speed of the linear phase shift algorithm of the present invention allows the implementation of a prospective motion gating scheme with minimal delay for data processing. This prospective gating scheme can deliver a trigger indication within 25 ms, i.e., within the same sequence TR of the navigator echo segment.

This linear phase shift method yields the slope of the k-space data in units of radians/pixel. Since the projection profile is apodized, there is a different scale conversion to units of distance in mm. The edge that represents the diaphragm (liver-lung field transition) varies with time. The other edge is stationary as a result of the filter function H(x) cutting off the inferior aspect of the liver. The Fourier shift theory describes the linear phase shift in k-space as corresponding to a translation or shift of an object in image space. However, the change in the projection profile of the diaphragm does not correspond to a simple function shift. As a result of respiratory motion, the motion of the idealized reference structure can be both a change in the width of the rectangular function and also a positional shift in the object. The measured linear phase shift corresponds then to the offset of the center-of-mass and not that of the edge. Letting the idealized signal from the liver be g(x), where:

$$g(x) = \begin{cases} 1 & x_0 < x < x(\tau) \\ 0 & \text{otherwise,} \end{cases} \qquad [9]$$

and the left-most edge at $X=X_0$ is stationary but $x(\tau)$ varies with time, it is clear that the width of this function varies as the diaphragm position $x(\tau)$ varies with respiration.

The center-of-mass of g(x) then varies as:

$$g_{\text{center}}(\tau) = x_0 + \frac{x_0}{2}, \qquad [10]$$

$$= \frac{x_0}{2} + \frac{x(t)}{2}$$

where τ denotes the time of the navigator echo acquisition within the scan. Thus, the measured linear phase shift corresponds to one-half of the actual edge displacement. The conversion between the measured linear phase shift and a positional phase shift is:

$$\text{displacement} = \frac{FOV}{\pi} \phi_d \qquad [11]$$

in mm, where FOV is the navigator acquired field-of-view.

Figure 3:
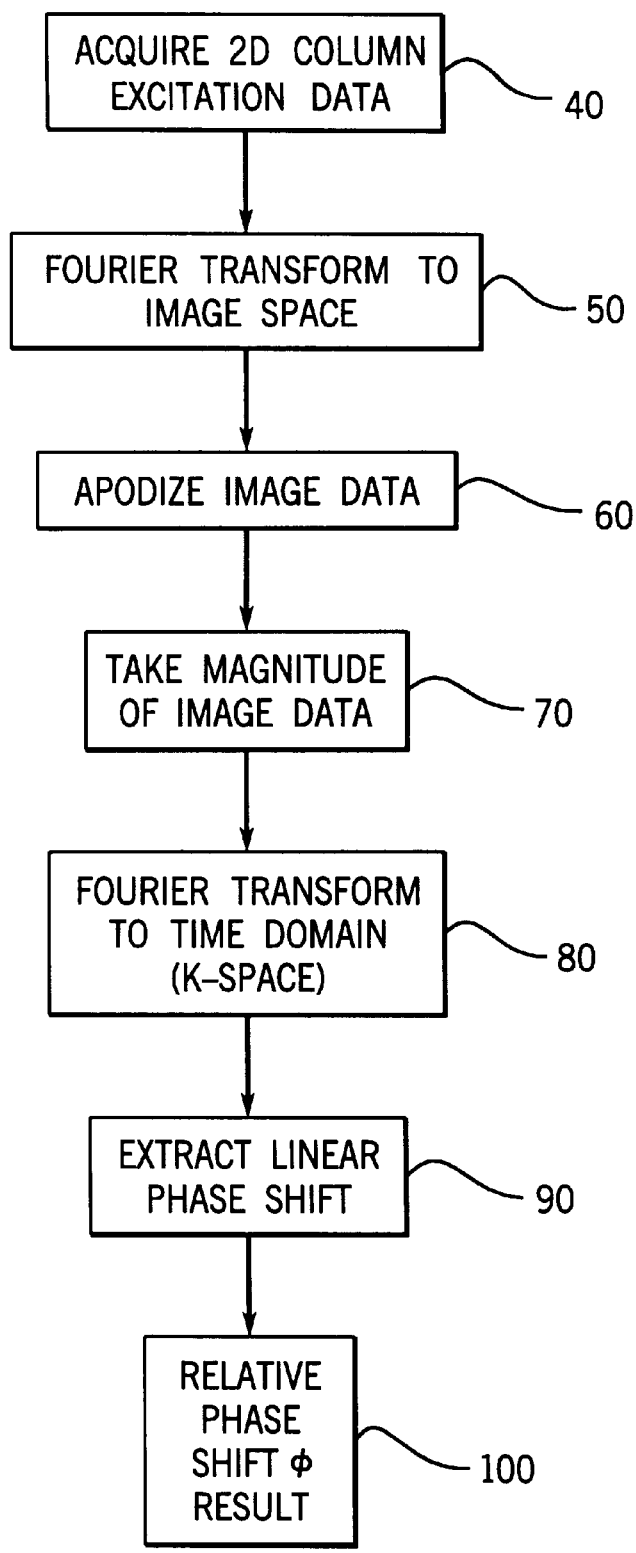
FIG. 3 is a flow chart for implementing the method of the present invention as a programmed system in a general computer.

Referring now to FIG. 3, the method and system of the present invention can be implemented with software programmed into a microprocessor, or general computer, according to the flow chart of FIG. 3. As shown, the first step is to acquire the sample data 40 for a reference position of a reference structure in a time domain. For example, the data may be acquired from a two-dimensional excitation column. The column may be rectangular, or cylindrical, or any other available configuration. According to the algorithm of the present invention, the next step is to Fourier transform the acquired time domain sample data into an image space 50, and then the image space domain sample data is apodized 60. In apodizing the data, the signal profile is effectively bandwidth limited by selectively slicing the end points from the signal profile to create a window of specific size encompassing a range of motion for the reference structure.

Since the apodized imaged data has real and imaginary components, the next step is to convert the apodized data to a real, positive value by taking the magnitude of the image data 70. For example, the root-mean-square method can be utilized to take the magnitude of the image data. Alternatively, the magnitude may be taken before apodizing to further reduce the number of computations. Next, the converted apodized data is inverse transformed back to the time domain, or k-space, at 80 and the linear phase shift is then extracted or determined at 90 from the inverse transformed data. Lastly, the relative phase shift φ is provided as the output 100. The output of one iteration provides the relative positional variation of the reference structure. Repeating the foregoing steps of FIG. 3 for sample data acquired at another time, will provide another relative positional variation of the reference structure such that the minimum and maximum values may be tracked as indicated by a sample output shown in FIG. 4.

In calculating a relative placement of the sample data from the phase shift as previously described, the result provides a representation of the relative position of the reference structure. A change in the phase shift then corresponds to a change in the positional displacement of the reference structure. As indicated, in a preferred embodiment, the reference structure is a human diaphragm and the method monitors lung inspiration and expiration. In this application, the invention calculates the relative position of the diaphragm by subtracting successive slopes of the image space sample data to then determine a maximum value of the phase shift that corresponds to an end of lung expiration, and a minimum value of the phase shift which corresponds to an end of lung inspiration. Preferably, a histogram of the sample data can be created for the most frequent phase shifts corresponding to the maximum values. The most frequent maximum value can then be saved as a trigger point to be used for the MRI scan such that MRI scanning data is saved at the same relative internal organ displacement repeatedly, thereby eliminating or greatly reducing the artifacts that create ghosts or blur in the MR images. To compensate for noise, an acceptance region is preferably created around the triggering point. It has been found that an appropriate tolerance factor may be +/−2 mm. Obviously, the tolerance factor is strictly a design choice and should be readily adjustable for various applications.

Figure 4:
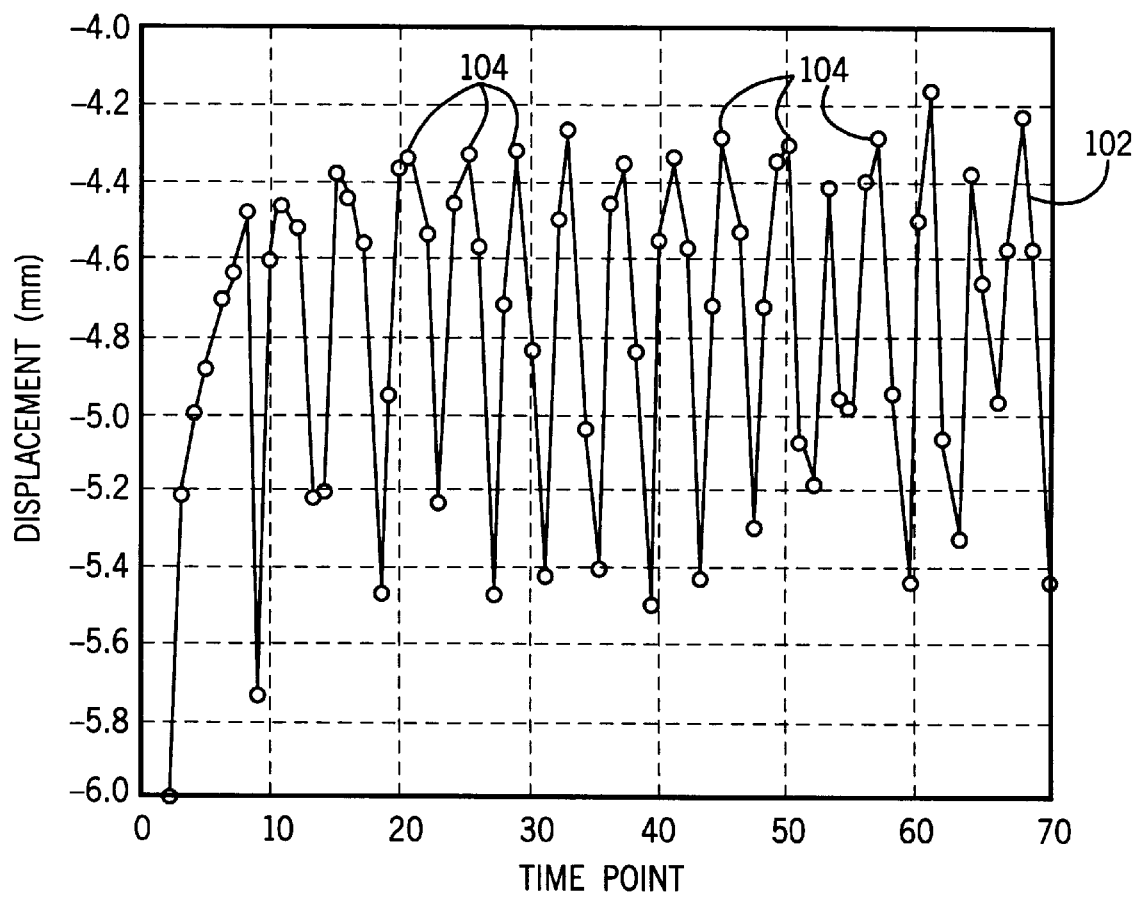
FIG. 4 is an exemplary wave form output showing the results of the present invention as a function of time versus displacement.

FIG. 4 shows an ECG-gated respiratory waveform 102 calculated from the navigator data in real-time using the linear phase shift algorithm for the present invention. The temporal resolution in FIG. 4 is approximately 900 ms/pt. It is evident from FIG. 4 that end-expiration 104 is the desired end point for synchronizing data acquisition, and by taking a mean value or a range of values about the mean value for the triggering point, the effects of artificial artifacts can be significantly reduced.

The training period described herein, is implemented as part of a pre-scan procedure and is identical in all respects to the actual imaging phase. A 15–20 second navigator echo pre-scan segment, which is dependant on heart rate, also allows the operator to view the displacement of the projection profile in real-time. If the displacement was not centered in the read-out window, an adjustment parameter could be modified to shift the profile. Although this phase shift method is sensitive to phase shifts from flow and signal intensity changes, these artifacts can be reduced by maintaining a dynamic steady-state during the tracking acquisition.

The assignments of the respiratory end-points to either the minimum or maximum linear phase shift, strictly depends on sign convention of the read-out gradient of the tracking sequence and may equivalently be transposed.

The present invention has been described in terms of the preferred embodiment, and it is recognized that equivalents, alternatives, and modifications, aside from those expressly stated, are possible and within the scope of the appending claims.

We claim:

1. A method for reference structure position determination using linear phase shift for use in magnetic resonance imaging (MRI), comprising the steps of:
   acquiring sample data representative of a reference position of a reference structure, the sample data acquired in a time domain;
   transforming the acquired time domain sample data into an image space domain;
   converting the image space domain sample data to a real positive value;
   inverse transforming the converted data back to the time domain; and
   determining a phase shift of the inverse transformed data as an indication of a relative positional variation for that data acquisition.

2. The method of claim 1 further comprising the step of calculating a relative displacement of the sampled data from the phase shift, wherein a calculation result is representative of the position of the reference structure.

3. The method of claim 1 wherein the step of acquiring data further includes imaging a two-dimensional excitation column for data acquisition.

4. The method of claim 1 wherein a change in phase shift corresponds to a change in the positional displacement of the reference structure.

5. The method of claim 1 wherein the reference structure is a human diaphragm and the method monitors lung inspiration and expiration and further comprises the steps of calculating a relative position of the diaphragm by measuring a linear phase shift of the time domain data, and determining a maximum value of the phase shift which corresponds to an end of lung expiration and a minimum value of the phase shift which corresponds to an end of lung inspiration.

6. The method of claim 5 further comprising the steps of creating a histogram of the sample data, recording the most frequent phase shifts corresponding to the maximum values, and saving the most frequent maximum value as a trigger point to be used for an MRI scan.

7. The method of claim 6 further comprising the step of determining a tolerance factor associated with the trigger value to compensate for noise.

8. The method of claim 6 wherein MRI scan data is saved only at the desired trigger point.

9. The method of claim 2 wherein the step of calculating is further defined as calculating a relative displacement $\phi$, where $\phi$ is given by:

$$\phi = \phi_0 + \phi_d = -\tan^{-1}\left(\frac{\sum_N Im(\hat{F}(t) \cdot \hat{F}*(t+1))}{\sum_N Re(\hat{F}(t) \cdot \hat{F}*(t+1))}\right)$$

where $\hat{F}(t) = F(t)\exp(j(\phi_0+\phi_d)t)$, and where $F(t)^*$ is a complex conjugate of $F(t)$.

10. The method of claim 9 where a change in $\phi$ provides a relative displacement in the reference structure.

11. The method of claim 1 further comprising the step of apodizing the image space domain sample data to a window of specific size encompassing a range of motion of the reference structure.

12. The method of claim 1 wherein the step of converting is further defined as taking a magnitude value of the sample data.

13. The method of claim 1 further comprising the steps of repeating the steps in claim 1 to obtain minimum and maximum values of the phase shift and calculating a relative displacement of the sampled data from the phase shift.

14. A system to determine a reference structure position in magnetic resonance imaging (MRI) using linear phase shift, the system comprising a microprocessor programmed to:
   acquire sample data for a reference position of a reference structure in a time domain;
   transform the acquired time domain sample data into an image space domain;
   convert the image space domain sample data to a real, positive value;
   inverse transform the converted data back to the time domain; and
   determine a phase shift for the inverse transformed data.

15. The system of claim 14 wherein the microprocessor is further programmed to calculate a relative displacement of the sampled data from the phase shift, wherein a calculation result is representative of the relative position of the reference structure.

16. The system of claim 15 further programmed to calculate a relative displacement $\phi$, where $\phi$ is given by:

$$\phi = \phi_0 + \phi_d = -\tan^{-1}\left(\frac{\sum_N Im(\hat{F}(t)\cdot\hat{F}*(t+1))}{\sum_N Re(\hat{F}(t)\cdot\hat{F}*(t+1))}\right)$$

where $\hat{F}(t)=F(t)\exp(j(\phi_0+\phi_d)t)$, and where $F(t)^*$ is a complex conjugate of $F(t)$.

17. The system of claim 14 wherein the reference structure is a human diaphragm and the system is further programmed to:

monitor lung inspiration and expiration;

calculate a relative position of the diaphragm by measuring a linear phase shift of the time domain data; and determine a maximum value of the phase shift corresponding to an end of lung expiration and a minimum value of the phase shift corresponding to an end of lung inspiration.

18. The system of claim 17 wherein MRI scan data is saved only at a desired trigger point.

19. The system of claim 17 further programmed to:

create a histogram of the sample data;

record the most frequent phase shifts corresponding to the maximum values; and save the most frequent maximum value as a trigger point to be used for an MRI scan.

20. The system of claim 19 further programmed to determine a tolerance factor associated with the trigger value to compensate for noise.

21. The system of claim 14 wherein the microprocessor is further programmed to apodize the converted data to a window of specific size encompassing a range of motion of the reference structure.

22. The system of claim 14 wherein the microprocessor is further programmed to take a magnitude value of the sample data.

23. The system of claim 14 wherein the microprocessor is further programmed to:

monitor anatomy movement;

calculate a relative position of the anatomy by measuring a linear phase shift of the time domain data; and determine a maximum value of the phase shift corresponding to one extreme of anatomy movement and a minimum value of the phase shift corresponding to another extreme of anatomy movement.

* * * * *

UNITED STATES PATENT AND TRADEMARK OFFICE
CERTIFICATE OF CORRECTION

PATENT NO. : 6,067,465
DATED : May 23, 2000
INVENTOR(S) : Foo, Thomas K.F., et al.

It is certified that error appears in the above-identified patent and that said Letters Patent is hereby corrected as shown below:

Title page:
Item [75] change "Megnon" to --New Berlin--.

Column 4:
Line 24, change "Mr. Charles C. Mulcahy" to --cm--.

Column 6:
Line 3, change $$"g_{center}(\tau) = x_0 + \frac{x_0}{2},"$$

$$= \frac{x_0}{2} + \frac{x(t)}{2}$$

to $$--g_{center}(\tau) = x_0 + \frac{x(t) - x_0}{2} --,$$

$$= \frac{x_0}{2} + \frac{x(t)}{2}$$

Signed and Sealed this

Seventh Day of August, 2001

*Attest:*

*Attesting Officer*

NICHOLAS P. GODICI
*Acting Director of the United States Patent and Trademark Office*